United States Patent [19]
Shepherd et al.

[11] Patent Number: 5,834,824
[45] Date of Patent: Nov. 10, 1998

[54] USE OF CONDUCTIVE PARTICLES IN A NONCONDUCTIVE BODY AS AN INTEGRATED CIRCUIT ANTIFUSE

[75] Inventors: William H. Shepherd, Palacitas, N. Mex.; Steve S. Chiang, Saratoga; John Y. Xie, San Jose, both of Calif.

[73] Assignee: Prolinx Labs Corporation, San Jose, Calif.

[21] Appl. No.: 405,259

[22] Filed: Mar. 14, 1995

Related U.S. Application Data

[63] Continuation-in-part of Ser. No. 194,110, Feb. 8, 1994, abandoned, Ser. No. 319,851, Oct. 7, 1994, Pat. No. 5,537,108, and Ser. No. 320,145, Oct. 7, 1994.

[51] Int. Cl.$^6$ .................................................. H01L 27/02
[52] U.S. Cl. ........................................... 257/530; 257/665
[58] Field of Search ............................. 257/50, 529, 530, 257/665, 1–5; 340/825.84

[56] References Cited

U.S. PATENT DOCUMENTS

| | | | |
|---|---|---|---|
| 3,335,327 | 8/1967 | Damon et al. | 317/101 |
| 3,384,879 | 5/1968 | Stahl et al. | 346/8 |
| 3,615,913 | 10/1971 | Shaw | 148/33.3 |
| 3,808,576 | 4/1974 | Castonguay et al. | 338/309 |
| 3,857,683 | 12/1974 | Castonguay | 29/195 |
| 3,864,715 | 2/1975 | Mastrangelo | 257/1 |
| 3,923,359 | 12/1975 | Newsam | 339/17 |
| 3,990,098 | 11/1976 | Mastrangelo | 257/5 |
| 4,024,629 | 5/1977 | Lemoine et al. | 29/625 |
| 4,090,667 | 5/1978 | Crimmins | 339/19 |

(List continued on next page.)

FOREIGN PATENT DOCUMENTS

| | | |
|---|---|---|
| 0336359 | 10/1989 | European Pat. Off. . |
| 510900-A2 | 10/1992 | European Pat. Off. . |
| 59-13368 | 1/1984 | Japan . |

OTHER PUBLICATIONS

"Taiyo PSR–400 Photoimageable Solder Mask (Two–Part Aqueous Developing System)", Taiyo America, Inc., 1992, pp. 1–8.

"Ball Grid Array Technology", John H. Lau, McGraw–Hill, Inc., 1995, p. 38.

Hwang, Jennie S., "Solder Paste in Electronics Packaging Technology and Applications in Surface Mount, Hybrid Circuits, and Component Assembly", Van Nostrand Reinhold, 1992 pp. xv–xx and 59–62.

"Polyswitch Resettable Fuses for Circuit Protection Information Package", Raychem Corporation, Electronics Division, Nov. 9, 1992.

G.R. Ruschau et al., "Critical Volume Fractions in Conductive Composites", Journal of Composite Materials, vol. 26, No. 18/1992, pp. 2727–2735.

(List continued on next page.)

*Primary Examiner*—Jerome Jackson
*Assistant Examiner*—John Guay
*Attorney, Agent, or Firm*—Skjerven, Morrill, MacPherson, Franklin & Friel LLP; Alan H. MacPherson; Omkar K. Suryadevara

[57] ABSTRACT

A novel antifuse includes a composite of conductive particles dispersed throughout a nonconductive matrix, which composite is located inside an antifuse via. The antifuse via is defined by a dielectric layer that separates two electrodes. The electrodes can be located in the same conductive layer plane (typically parallel to and isolated from one another) or in two different conductive planes (typically formed transverse to one another and separated by a dielectric with an antifuse via formed therein). The electrodes can be coupled to, for example, active or passive regions of the integrated circuit. One embodiment of an antifuse (also called "composite antifuse") has only the composite in an antifuse via between the two conductive layers. Another embodiment of an antifuse (also called "hybrid antifuse") includes in addition to the composite, one or more thin dielectric layers also located in the antifuse via between the two conductive layers.

10 Claims, 12 Drawing Sheets

U.S. PATENT DOCUMENTS

| | | | |
|---|---|---|---|
| 4,146,863 | 3/1979 | Mollenhoff | 337/296 |
| 4,238,839 | 12/1980 | Redfern et al. | 365/96 |
| 4,245,273 | 1/1981 | Feinberg et al. | 361/382 |
| 4,247,981 | 2/1981 | Walters | 29/845 |
| 4,386,051 | 5/1983 | Edgington | 420/589 |
| 4,399,372 | 8/1983 | Tanimoto et al. | 307/279 |
| 4,413,272 | 11/1983 | Mochizuki et al. | 257/529 |
| 4,420,820 | 12/1983 | Preedy | 365/105 |
| 4,424,578 | 1/1984 | Miyamoto | 365/104 |
| 4,433,331 | 2/1984 | Kollaritsch | 340/825.83 |
| 4,434,134 | 2/1984 | Darrow et al. | 419/5 |
| 4,455,495 | 6/1984 | Masuhara et al. | 307/44 |
| 4,458,297 | 7/1984 | Stopper et al. | 361/403 |
| 4,488,262 | 12/1984 | Basire et al. | 365/104 |
| 4,491,860 | 1/1985 | Lim | 257/529 |
| 4,507,756 | 3/1985 | McElroy | 365/104 |
| 4,507,757 | 3/1985 | McElroy | 365/104 |
| 4,547,830 | 10/1985 | Yamauchi | 361/104 |
| 4,562,639 | 1/1986 | McElroy | 29/584 |
| 4,565,712 | 1/1986 | Noguchi et al. | 427/53.1 |
| 4,566,186 | 1/1986 | Bauer et al. | 29/852 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,609,241 | 9/1986 | Peterson | 339/17 |
| 4,642,160 | 2/1987 | Burgess | 165/630 |
| 4,651,409 | 3/1987 | Ellsworth et al. | 29/576 |
| 4,652,974 | 3/1987 | Ryan | 361/395 |
| 4,678,889 | 7/1987 | Yamanaka | 219/121 |
| 4,689,441 | 8/1987 | Dick et al. | 174/68.5 |
| 4,700,116 | 10/1987 | Inoue et al. | 318/254 |
| 4,700,214 | 10/1987 | Johnson | 257/209 |
| 4,710,592 | 12/1987 | Kimbara | 174/68.5 |
| 4,721,868 | 1/1988 | Cornell et al. | 307/465 |
| 4,726,991 | 2/1988 | Hyatt et al. | 428/329 |
| 4,731,704 | 3/1988 | Lochner | 361/400 |
| 4,732,780 | 3/1988 | Mitoff et al. | 427/125 |
| 4,748,490 | 5/1988 | Hollingsworth | 357/51 |
| 4,757,359 | 7/1988 | Chiao et al. | 357/23.5 |
| 4,780,670 | 10/1988 | Cherry | 324/158 |
| 4,786,904 | 11/1988 | Graham, III et al. | 340/825 |
| 4,789,760 | 12/1988 | Koyama et al. | 174/68.5 |
| 4,791,075 | 12/1988 | Lin | 437/209 |
| 4,792,646 | 12/1988 | Enomoto | 174/68.5 |
| 4,792,835 | 12/1988 | Sacarisen et al. | 357/23.6 |
| 4,796,074 | 1/1989 | Roesner | 357/51 |
| 4,796,075 | 1/1989 | Whitten | 357/51 |
| 4,799,128 | 1/1989 | Chen | 361/414 |
| 4,799,984 | 1/1989 | Rellick | 156/89 |
| 4,803,595 | 2/1989 | Kraus et al. | 361/412 |
| 4,808,967 | 2/1989 | Rice et al. | 338/309 |
| 4,809,044 | 2/1989 | Pryor et al. | 257/3 |
| 4,821,142 | 4/1989 | Ushifusa et al. | 361/395 |
| 4,823,181 | 4/1989 | Mohsen et al. | 357/51 |
| 4,829,404 | 5/1989 | Jensen | 361/398 |
| 4,839,864 | 6/1989 | Fujishima | 365/200 |
| 4,840,924 | 6/1989 | Kinbara | 437/195 |
| 4,841,099 | 6/1989 | Epstein et al. | 174/68.5 |
| 4,845,315 | 7/1989 | Stopper | 361/428 |
| 4,847,732 | 7/1989 | Stopper et al. | 361/395 |
| 4,864,165 | 9/1989 | Hoberman et al. | 307/467 |
| 4,873,506 | 10/1989 | Gurevich | 337/290 |
| 4,874,711 | 10/1989 | Hughes et al. | 437/8 |
| 4,876,220 | 10/1989 | Mohsen et al. | 437/170 |
| 4,881,144 | 11/1989 | Mohsen et al. | 357/54 |
| 4,882,611 | 11/1989 | Blech et al. | 357/51 |
| 4,888,574 | 12/1989 | Rice et al. | 338/309 |
| 4,888,665 | 12/1989 | Smith | 361/400 |
| 4,892,776 | 1/1990 | Rice | 428/209 |
| 4,893,167 | 1/1990 | Boudou et al. | 357/51 |
| 4,897,836 | 1/1990 | Fitzpartick et al. | 370/112 |
| 4,899,205 | 2/1990 | Hamdy et al. | 357/51 |
| 4,910,418 | 3/1990 | Graham et al. | 307/465 |
| 4,910,584 | 3/1990 | Mizuo | 257/713 |
| 4,914,055 | 4/1990 | Gordon et al. | 437/192 |
| 4,915,983 | 4/1990 | Lake et al. | 427/98 |
| 4,916,809 | 4/1990 | Boudou et al. | 29/852 |
| 4,920,454 | 4/1990 | Stopper et al. | 361/398 |
| 4,924,287 | 5/1990 | Orbach | 357/51 |
| 4,933,738 | 6/1990 | Orbach et al. | 257/665 |
| 4,935,584 | 6/1990 | Boggs | 174/262 |
| 4,937,475 | 6/1990 | Rhodes et al. | 307/465 |
| 4,940,181 | 7/1990 | Juskey, Jr. et al. | 228/180.21 |
| 4,943,538 | 7/1990 | Mohsen et al. | 437/52 |
| 4,949,084 | 8/1990 | Schwarz et al. | 340/825.83 |
| 4,964,948 | 10/1990 | Reed | 156/659.1 |
| 4,969,124 | 11/1990 | Luich et al. | 365/201 |
| 4,970,579 | 11/1990 | Arldt et al. | 257/718 |
| 4,974,048 | 11/1990 | Chakravorty et al. | 257/530 |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. | 257/735 |
| 5,030,113 | 7/1991 | Wilson | 439/80 |
| 5,055,321 | 10/1991 | Enomoto et al. | 427/98 |
| 5,055,973 | 10/1991 | Mohsen | 361/414 |
| 5,060,116 | 10/1991 | Grobman et al. | 361/474 |
| 5,068,634 | 11/1991 | Shrier | 338/21 |
| 5,077,451 | 12/1991 | Mohsen | 174/261 |
| 5,087,589 | 2/1992 | Chapman et al. | 437/195 |
| 5,092,032 | 3/1992 | Murakami | 29/830 |
| 5,097,593 | 3/1992 | Jones et al. | 29/852 |
| 5,099,149 | 3/1992 | Smith | 307/465 |
| 5,099,380 | 3/1992 | Childers et al. | 361/56 |
| 5,106,773 | 4/1992 | Chen et al. | 437/51 |
| 5,108,541 | 4/1992 | Schneider et al. | 156/631 |
| 5,120,679 | 6/1992 | Boardman et al. | 437/195 |
| 5,136,366 | 8/1992 | Worp et al. | 257/687 |
| 5,142,263 | 8/1992 | Childers et al. | 338/21 |
| 5,144,567 | 9/1992 | Oelsch et al. | 364/708 |
| 5,148,265 | 9/1992 | Khandros et al. | 357/80 |
| 5,148,355 | 9/1992 | Lowe et al. | 361/410 |
| 5,155,577 | 10/1992 | Chance et al. | 357/71 |
| 5,166,556 | 11/1992 | Hsu et al. | 307/465 |
| 5,181,096 | 1/1993 | Forouhi | 259/530 |
| 5,181,859 | 1/1993 | Foreman et al. | 439/225 |
| 5,189,387 | 2/1993 | Childers et al. | 338/20 |
| 5,191,511 | 3/1993 | Sawaya | 361/383 |
| 5,196,724 | 3/1993 | Gordon et al. | 257/530 |
| 5,200,652 | 4/1993 | Lee | 307/465 |
| 5,203,075 | 4/1993 | Angulas et al. | 29/830 |
| 5,210,940 | 5/1993 | Kawakami et al. | 29/852 |
| 5,216,278 | 6/1993 | Lin et al. | 257/688 |
| 5,218,679 | 6/1993 | Hasegawa et al. | 395/275 |
| 5,220,490 | 6/1993 | Weigler et al. | 361/409 |
| 5,229,549 | 7/1993 | Yamakawa et al. | 174/262 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,250,470 | 10/1993 | Yamaguchi | 437/211 |
| 5,258,643 | 11/1993 | Cohen | 257/530 |
| 5,260,519 | 11/1993 | Knickerbocker et al. | 174/262 |
| 5,260,848 | 11/1993 | Childers | 361/127 |
| 5,262,754 | 11/1993 | Collins | 338/21 |
| 5,264,729 | 11/1993 | Rostoker et al. | 257/774 |
| 5,282,271 | 1/1994 | Hsieh et al. | 395/275 |
| 5,282,312 | 2/1994 | DiStefano et al. | 29/830 |
| 5,287,620 | 2/1994 | Suzuki et al. | 29/852 |
| 5,300,208 | 4/1994 | Angelopoulos et al. | 205/50 |
| 5,311,053 | 5/1994 | Law et al. | 257/529 |

| | | | |
|---|---|---|---|
| 5,317,801 | 6/1994 | Tanaka et al. | 29/830 |
| 5,319,238 | 6/1994 | Gordon et al. | 257/530 |
| 5,321,322 | 6/1994 | Verheyen et al. | 307/465.1 |
| 5,329,153 | 7/1994 | Dixit | 257/530 |
| 5,345,106 | 9/1994 | Doering et al. | 257/675 |
| 5,346,750 | 9/1994 | Hatakeyama et al. | 428/209 |
| 5,347,258 | 9/1994 | Howard et al. | 338/333 |
| 5,349,248 | 9/1994 | Parlour et al. | 307/465 |
| 5,362,676 | 11/1994 | Gordon et al. | 437/192 |
| 5,367,764 | 11/1994 | DiStefano et al. | 29/830 |
| 5,377,124 | 12/1994 | Mohsen | 364/489 |
| 5,397,921 | 3/1995 | Karnezos | 257/779 |
| 5,404,637 | 4/1995 | Kawakami | 29/843 |
| 5,409,865 | 4/1995 | Karnezos | 437/210 |
| 5,410,806 | 5/1995 | Schneider | 29/840 |
| 5,420,456 | 5/1995 | Galbi et al. | 257/529 |
| 5,420,460 | 5/1995 | Massingill | 257/693 |
| 5,435,480 | 7/1995 | Hart et al. | 228/180.1 |
| 5,436,412 | 7/1995 | Ahmad et al. | 174/265 |
| 5,438,166 | 8/1995 | Carey et al. | 174/261 |
| 5,464,790 | 11/1995 | Hawley | 437/60 |
| 5,468,995 | 11/1995 | Higgins, III | 257/697 |
| 5,481,795 | 1/1996 | Hatakeyama et al. | 29/852 |
| 5,487,218 | 1/1996 | Bhatt et al. | 29/852 |
| 5,502,889 | 4/1996 | Casson et al. | 29/830 |
| 5,537,108 | 7/1996 | Nathan et al. | 340/825.84 |
| 5,572,409 | 11/1996 | Nathan et al. | 361/806 |
| 5,574,311 | 11/1996 | Matsuda | 257/697 |
| 5,583,376 | 12/1996 | Sickler | 257/702 |
| 5,583,378 | 12/1996 | Marrs et al. | 257/710 |
| 5,612,574 | 3/1997 | Summerfelt et al. | 257/783 |

OTHER PUBLICATIONS

S. Chiang, et al., "Conductive Channel in ONO Formed by Controlled Dielectric Breakdown", 1992 Symposium on VLSI Technology Digest of Technical Papers, pp. 20–21.

S. Chiang, et al., "Antifuse Structure Comparison for Field Programmable Gate Arrays", IEDM, 1992, pp. 611–614.

K. Gordon, et al., "Conducting Filament of the Programmed Metal Electrode Amorphous Silicon Antifuse", IEDM, 1993, pp. 27–30.

C. Hu, "Interconnect Devices for Field Programmable Gate Array", IEDM, 1992, pp. 591–594.

"Process Considerations In Restructurable VLSI For Wafer–Scale Integration", P.W. Wyatt, et al., IEDM, 1984, pp. 626–629.

"A Laser Linking Process For Restructurable VLSI", G.H. Chapman, et al., Massachusetts Institute of Technology, Lincoln Laaboratory CLEO, Apr. 14–16, 1982, pp. 1–4.

Joshua Silver, "High–Performance Scalable Switch Design," ASIC & EDA, Jun. 1994, pp. 38–48.

Kathryn E. Gordon and Richard J. Wong, "Conducting Filament of the Programmed Metal Electrode Amorphous Silicon Antifuse," IEEE, 1993, pp. 27–30.

Paul C. Yu, Steven J. Decker, Hae–Seung Lee, Charles G. Sodini and John L. Wyatt, "CMOS Resistive Fuses for Image Smoothing and Segementation," 1992 IEEE, IEEE Journal of Solid–State Circuits, vol. 27, No. 4, Apr. 1992, pp. 545–553.

Chenming Hu, "Interconnect Devices for Field Programmable Gate Array," IEEE, 1992, pp. 591–594.

Steve Chiang, Rahim Forouhi, Wenn Chen, Frank Hawley, John McCollum, Esmat Hamdy and Chenming Hu, "Antifuse Structure Comparison for Field Programmable Gate Arrays," IEEE, 1992, pp. 611–614.

Bernie DiMarco and Steve Hansen, "Interplay of Energies in Circuit Breaker and Fuse Combinations," 1991 IEEE, pp. 1765–1769.

Fred Ki, Raj Bachireddy, Darryl Jeong, Steve Cheng and Thu Nguyen, "An Ultra High Speed ECL Programmable Logic Device," IEEE 1990 Bipolar Circuits and Technology Meeting 3.1.

Ali Iranmanesh, Steve Jurichich, Vida Ilderem, Rick Jerome, SP Joshi, Madan Biswal, Bami Bastani, "Advanced Single Poly BiCMOS Technology for High Performance Programmable TTL/ECL Applications," IEEE, 1990.

Ron Iscoff, "Characterizing Quickturn ASICS: It's Done with Mirrors," Semiconductor International, Aug. 1990.

Esmat Hamdy, John McCollum, Shih–ou Chen, Steve Chiang, Shafy Eltoukhy, Jim Chang, Ted Speers, and Amr Mohsen, "Dielectric Based Antifuse for Logic and Memory ICs," IEDM, 1988, pp. 786–789.

James B. Gullette and Douglas M. Green, "Laser Personalization of NMOS Digital Topologies," Texas A&M University, 1993 IEEE, International Syposium on Circuits and Systems, pp. 1249–1252.

Masafumi Tanimoto, Junichi Murota, Yasuo Ohmori, and Nobuaki Ieda, "A Novel MOS PROM Using a Highly Resistive Poly–Si Resistor," 1980 IEEE, pp. 517–520.

"A Large Format Modified TEA $CO_2$ Laser Based Process for Cost Effective Small Via Generation", J.M. Morrison, etc., MCM 1994 Proceedings, pp. 369–337.

"The Application of Laser Process Technology to Thin Film Packaging", T.F. Redmond, etc., IEEE, 1992, pp. 1066–1071.

"Matsushita Team Eliminates Holes in High–Density PCB", Kenji Tsuda, Nikkei Electronics Asia, Mar. 1995, pp. 69–70.

"I/O Buffering System to a Programmable Switching Apparatus", Wen–Jai Hsieh, Official Gazette, Jan. 25, 1994, one page.

"A New Circuit Substrate For MCM–L", Yusuke Wada, ICEMCM, 1995, pp. 59–64.

Letter to Hugo Goris from J. Rapaille, Philips Components, Jul. 6, 1994, one page.

USE OF CONDUCTIVE PARTICLES IN A NONCONDUCTIVE BODY AS AN INTEGRATED CIRCUIT ANTIFUSE

CROSS-REFERENCE TO RELATED APPLICATIONS

This application is a continuation-in-part of U.S. patent application Ser. No. 08/319,851 filed Oct. 7, 1994, now U.S. Pat. No. 5,537,108 issued Jul. 16, 1996 which is in turn a continuation-in-part of U.S. patent application Ser. No. 08/194,110 filed Feb. 8, 1994, now abandoned.

This application is also a continuation-in-part of U.S. patent application Ser. No. 08/320,145 filed Oct. 7, 1994, now pending which is in turn a continuation-in-part of U.S. patent application Ser. No. 08/194,110 filed Feb. 8, 1994, now abandoned.

This application is also a continuation-in-part of U.S. patent application Ser. No. 08/194,110 filed Feb. 8, 1994, now abandoned.

FIELD OF THE INVENTION

This invention relates generally to field programmable antifuses in integrated circuits. In particular, this invention relates to the use of conductive particles in a nonconductive body as an antifuse dielectric layer in integrated circuit.

BACKGROUND OF THE INVENTION

A common programmable element used in an integrated circuit (IC) such as a field programmable gate array (FPGA) is an antifuse. An antifuse 100 (FIG. 1) in a prior art integrated circuit is typically constructed by forming a thin antifuse dielectric layer 101 over an exposed portion of a first conductive layer electrode 102 in an antifuse via 103 that is defined by an interelectrode dielectric layer 104. Antifuse dielectric layer 101 has a thickness of around 1500 angstroms and can be formed of amorphous silicon, also called "a-Si," as described in U.S. Pat. No. 4,914,055 to Gordon et. al. A second conductive layer electrode 105 is typically formed over interelectrode dielectric layer 104 and in contact with antifuse dielectric layer 101 inside antifuse via 103.

U.S. Pat. No. 5,166,556 discloses an antifuse layer sandwiched between two layers of titanium. U.S. Pat. No. 4,823,181 discloses an antifuse that includes a first layer of silicon dioxide, a second layer of silicon nitride and a third layer of silicon dioxide. Antifuses using a spacer inside an antifuse via are disclosed in U.S. Pat. Nos. 5,120,679 and 5,196,724.

A conductive channel 106 (FIG. 1) can be formed by applying a voltage, also called a "programming voltage" between first and second conductive layer electrodes 102 and 105 to cause a permanent physical breakdown in antifuse dielectric layer 101, thereby changing an antifuse from a nonconducting OFF state into a conducting ON state. Such "programming" from an OFF state to an ON state allows devices inside an IC to be interconnected in the "field" e.g. by a user, to perform a custom function as determined by the user. Conductive channel 106 typically forms at a corner (or edge) of via 103 due to the well known thinning problem that reduces yield and reliability of conventional antifuses. In a conventional antifuse the programming voltage is inversely proportional to the capacitance so that to reduce the programming voltage by a factor of e.g. ten automatically requires an increase in capacitance by a like factor.

Low resistance and low capacitance are desirable objects of an improved antifuse, as described in U.S. Pat. No. 4,914,055. Capacitance is proportional to area and dielectric constant and inversely proportional to the dielectric thickness. An antifuse dielectric layer of a-Si has a high dielectric constant of 11 and hence requires a larger thickness to have the same capacitance as a silicon dioxide layer having a dielectric constant of 3.9 but the same area.

If an antifuse dielectric layer's thickness is increased to reduce the antifuse capacitance, the created conductive channel can become resistive and even result in the conductive channel switching from a conducting ON state to a nonconducting OFF state, as described by Chiang et. al. in "Antifuse Structure Comparison for Field Programmable Gate Arrays", IEDM, 1992, pp. 611–614.

A conductive channel created in a-Si layer sandwiched between TiW layers has a low resistance value (i.e. about 150 ohms), as disclosed in Gordon. et. al. "Conducting Filament of the Programmed Metal Electrode Amorphous Silicon Antifuse" IEDM, 1993, pp 27–30.

U.S. Pat. No. 5,258,643 describes a nitride/oxide/nitride (also called "NON") antifuse dielectric layer sandwiched between refractory metals such as molybdenum(Mo). NON based antifuses have a smaller thickness and hence higher capacitance as compared to a-Si based antifuses.

A conductive channel created in an ONO layer sandwiched between polysilicon and silicon substrate consists of polysilicon and has a high resistance value (i.e. about 500 ohms), as described in Chiang. et.al. "Conductive Channel in ONO formed by Controlled Dielectric Breakdown", IEEE VLSI Tech. Symposium 1992, pp. 20–21. During programming of ONO antifuses, local melting of electrodes, e.g. polysilicon or single crystal silicon substrate, takes place and the conductive channel is formed by transport of the molten electrode material into the ruptured region of the dielectric. In addition to transport of the molten electrode material, programming of amorphous silicon antifuses also involves melting and recrystalization of amorphous silicon.

Choice of electrode material also affects an antifuse's resistance as the conductive channel's switching to OFF state is similar in nature to electromigration during long term low current operation as described by Hu in "Interconnect Devices for Field Programmable Gate Array", IEDM 1992, pp.591–594. There appears to be no prior art suggestion to use, a composite that includes a number of conductive particles dispersed in a nonconductive body to form an antifuse (in, for example, an integrated circuit). Such a composite has a resistance that can be varied by changing the percentage by volume (also called loading) of the conductive particles. When a composite's loading is low, the conductive particles are isolated (i.e. physically separated from each other) and surrounded by the material of the nonconductive body, and the composite's resistivity is close to that of the body material, which resistivity can be as high as for example $10^{15}$ ohm.cm for a polymer. The loading can be increased up to a critical level, also called critical volume Vc (FIG. 2), while maintaining high resistivity of the composite.

As the loading is increased and approaches the critical volume Vc, the particles begin to contact each other such that conductive paths begin to form, and the composite's resistivity begins to fall sharply. With further increases in loading, the particles are forced firmly together to form a stable low resistance path. Around a critical volume Vc, the resistivity of a composite can change by up to (10) orders of magnitude for a small increase in the fraction of conductive particles as described in, for example, "Critical Volume Fractions in Conductive Composites" by G. R. Ruschan and R. G. Newnham, Journal of Composite Materials, Vol. 26, No. 18, 1992, that is incorporated herein in its entirety.

Composites with a loading greater than critical volume Vc are used as electrically conductive pastes, such as solder paste as described in, for example "Solder Paste in Electronics Packaging" by Jennie S. Huang, van Nostrand Reinhold, New York, 1992. A composite with a loading greater than critical volume Vc can also be used as a fuse in a circuit surge protection device of the type described in "PolySwitch Resettable Fuses for Circuit Protection Information Package", by Raychem Corporation, Electronics Group, 300 Constitution Drive, Menlo Park, Calif. 94025-1164, Phone 800-272-9243, extension 1501.

A composite with a loading below critical volume Vc can be used as a fuse in a voltage surge protection device (also called "ESD device") of the type described in, for example, U.S. Pat. Nos. 4,726,991, 4,977,357, 4,922,333, 5,068,634, 5,099,380, 5,142,263, 5,189,387, 5,248,517, 5,260,848, or 5,262,754.

SUMMARY OF THE INVENTION

In accordance with this invention, a novel antifuse includes a "composite" of conductive particles dispersed throughout a nonconductive matrix located between two electrodes. In one embodiment, the composite is located inside an antifuse via defined by a dielectric layer that separates two electrodes typically formed transverse to one another. In another embodiment, the composite is located between two electrodes that are located in the same conductive layer plane, typically parallel to and isolated from one another.

One embodiment of this invention (called a "composite antifuse") is implemented in an integrated circuit and has only the composite between two electrodes. Another embodiment of this invention (called a "hybrid antifuse") also implemented in an integrated circuit, includes in addition to the composite one or more thin dielectric layers also located between the two electrodes. The electrodes can be coupled to active or passive regions of the integrated circuit.

One advantage of using a composite is that in spite of the presence of conductive particles, the capacitance of the novel antifuse is lower than the capacitance of prior art antifuses, because the thickness of the nonconductive matrix and therefore the distance between the electrodes is much larger than in the prior art. Furthermore, a nonconductive matrix can be chosen to have a very low dielectric constant, to further reduce the antifuse's capacitance. Finally, the effective area of the conductive particles is also lower than the total area of the composite facing an electrode, thus again reducing the antifuse's capacitance.

Another advantage of using the composite is that the conductive particles can be chosen to reduce the ON state resistance and improve reliability, by eliminating the prior art need to adjust the metal electrode, such as adding a TiW layer in contact with the amorphous silicon antifuse layer. Conductive particles can also be chosen to have a high conductivity to again reduce ON state resistance.

The process of this invention for forming the antifuse of this invention is simple and inexpensive as compared to prior art antifuse formation processes. Further, the antifuse process of this invention eliminates the prior art's planarization problem that is caused by adding extra layers, e.g. TiW to prevent electromigration, and thus improves yield. The novel antifuse process of this invention also automatically increases the effective thickness of an antifuse at the via edge and thus improves reliability and yield, eliminating the prior art's need for a spacer.

Also, the OFF state reliability of the novel antifuse of this invention is not compromised by choice of materials because this antifuse has lower leakage current than a prior art antifuse.

Moreover, the present invention eliminates the in process plasma damage from the prior art etching of oxide spacers that results in exposure of the antifuse dielectric layer to the plasma.

During fabrication of a novel antifuse of this invention, the loading (i.e. volume percentage of the conductive particles in the body) and the size of the conductive particles can be selected to obtain a predetermined effective thickness of the nonconductive matrix and hence a predetermined the programming voltage and a predetermined current carrying capacity of the antifuse.

DETAILED DESCRIPTION

Figure 1:
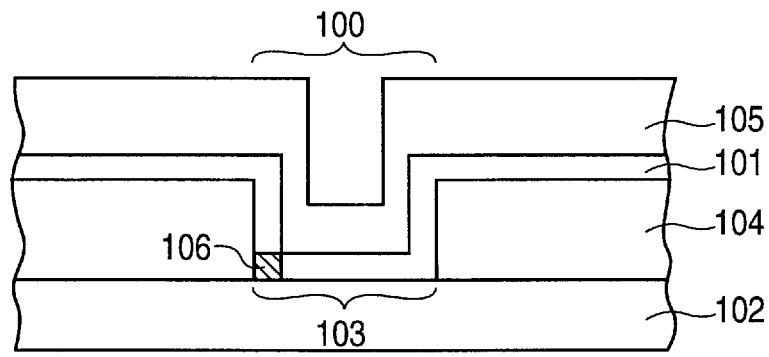
FIG. 1 shows a cross-sectional view of a typical prior art IC antifuse.
Figure 2:
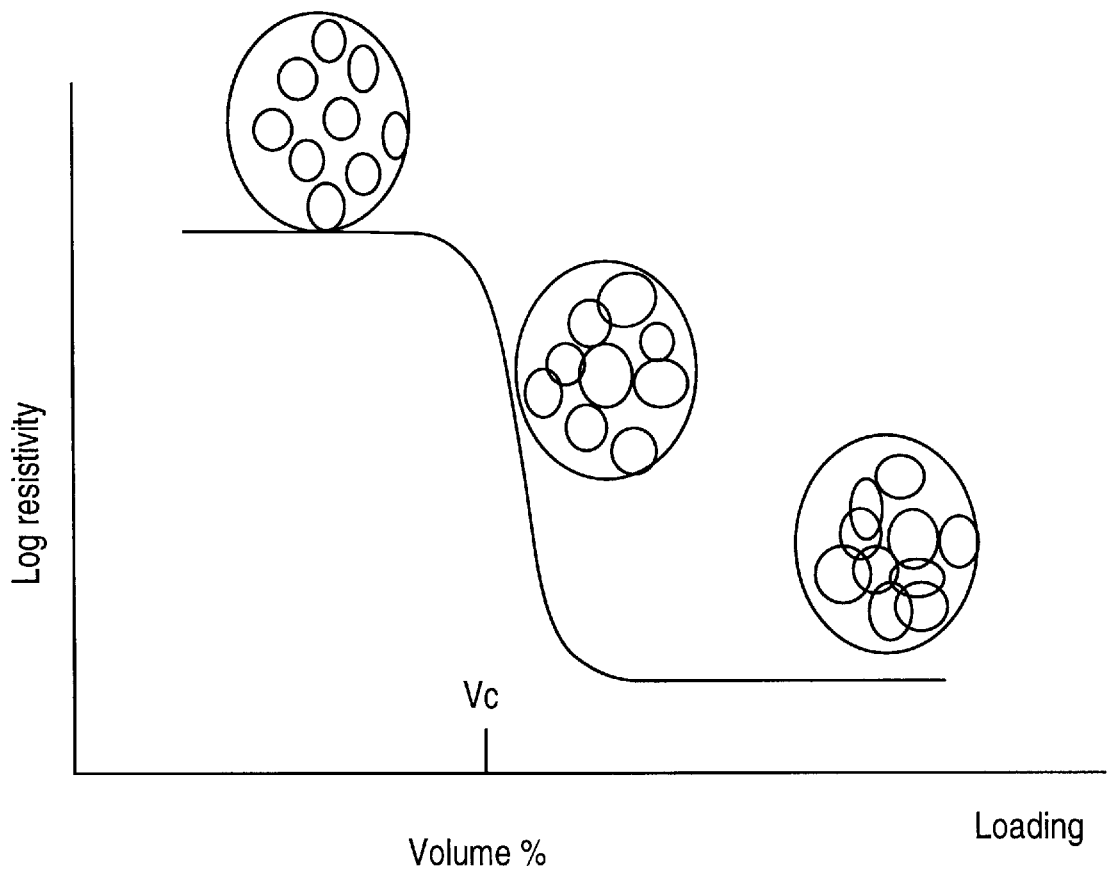
FIG. 2 illustrates a typical relationship between resistivity and loading for a prior art composite.

Use of a composite to form an antifuse of, for example printed circuit boards (PCBs), was described in U.S. patent applications Ser. No. 08/194,110 and Ser. No. 08/320,145 that are incorporated by reference herein in their entirety.

In an integrated circuit (abbreviated "IC") 300 (only a portion of which is shown in cross-section in FIG. 3A) employing the novel antifuse of this invention, an antifuse 320 has a composite 310 of conductive particles 311A–311N (N being the number of particles) dispersed in a nonconductive body 312 that is located inside an antifuse via 303.

Antifuse via 303 is defined by an opening in interelectrode dielectric layer 304 that separates a first conductive layer electrode 302 from a second conductive layer electrode 305. Electrodes 302 and 305 are typically formed transverse to one another.

Figure 3A:
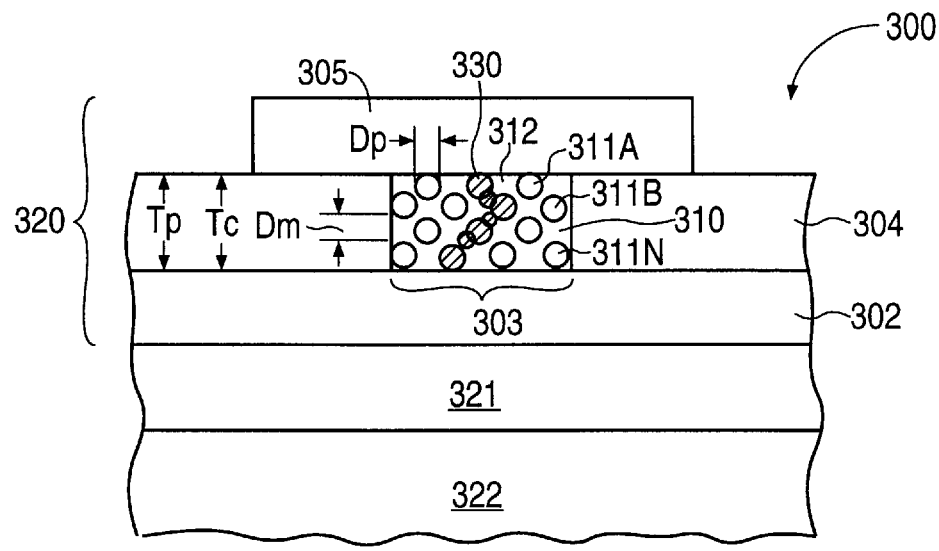
FIG. 3A illustrates in a cross-sectional view, the structure of a novel composite antifuse formed in a portion of an integrated circuit in one embodiment.
Figure 3B:
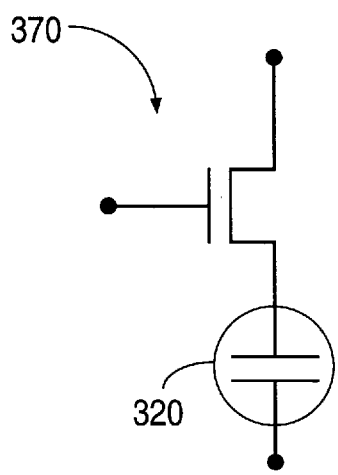
FIG. 3B illustrates the use of the composite antifuse of FIG. 3A with a transistor of the integrated circuit in one embodiment.

Although a single antifuse is illustrated in FIG. 3A, IC 300 has a number of such antifuses. Two or more antifuse electrodes that lie in the same conductive layer plane are typically formed parallel to and isolated from one another and are coupled to, for example, an active region of transistor 370 (FIG. 3B) of IC 300, to allow a user to perform a predetermined custom function by programming one or more of the antifuses as necessary. In one specific embodiment, IC 300 does not have a common ground plane that ties all antifuses together. Antifuse 320 can be formed over an isolation layer 321 (that can be an oxide layer) supported by a silicon semiconductor substrate 322.

Optionally, intervening layers such as metal interconnect layers or polysilicon layers of transistors (not shown) can be formed as necessary between isolation layer 321 and substrate 322.

Figure 3C:
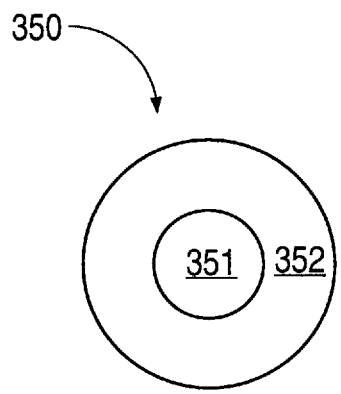
FIG. 3C illustrates in a cross sectional view, the structure of a conductive particle that has a core surrounded by a coating.

Conductive particles 311A–311N can be formed of, for example, copper. A conductive particle 350 (FIG. 3C) of a composite can be formed of a conductive core 351 coated by another conductive layer 352 to allow balancing of improved reliability and lower ON state resistance of an antifuse, as compared to using particles of the same material. Instead of conductive particles 311A–311N (FIG. 3A) other conductive channel forming material can also be used in composite 310. Nonconductive body 312 can be formed of, for example, a-Si, silicon dioxide or a polymer, such as a metallo-organic polymer. Examples of an IC antifuse composite 310 include (1) metal or semiconductor particles dispersed in an inorganic dielectric, e.g. spin-on glass (also called "SOG") or an organic dielectric, e.g. polyimide (2) conductive organic particles in either organic or inorganic insulating matrices.

Use of particles 311A–311N dispersed throughout a body 312 eliminates the prior art need to make antifuse dielectric layer 101 (FIG. 1) as thin as possible to obtain the lowest programming voltage. Instead, in forming novel IC 300, the material of nonconductive body 312 can be chosen to have a low dielectric constant to lower the novel antifuse's capacitance below that of the prior art. The use of a composite 310 increases the physical distance Tp between the two conductive layers 302 and 305 of novel antifuse 320 and also contributes to lower antifuse capacitance, as compared to prior art. The conductive particles 311A–311N can be chosen to have low resistivity to lower the ON state resistance of novel antifuse 320, as compared to the prior art antifuses.

In the embodiment of FIG. 3A, antifuse 320 is a "composite antifuse" that has only composite 310 and nothing else inside antifuse via 303 between electrodes 302 and 305. In other embodiments, of this invention a "hybrid antifuse" as described below includes inside an antifuse via, in addition to a composite, an antifuse dielectric layer between the two electrodes.

Figure 4:
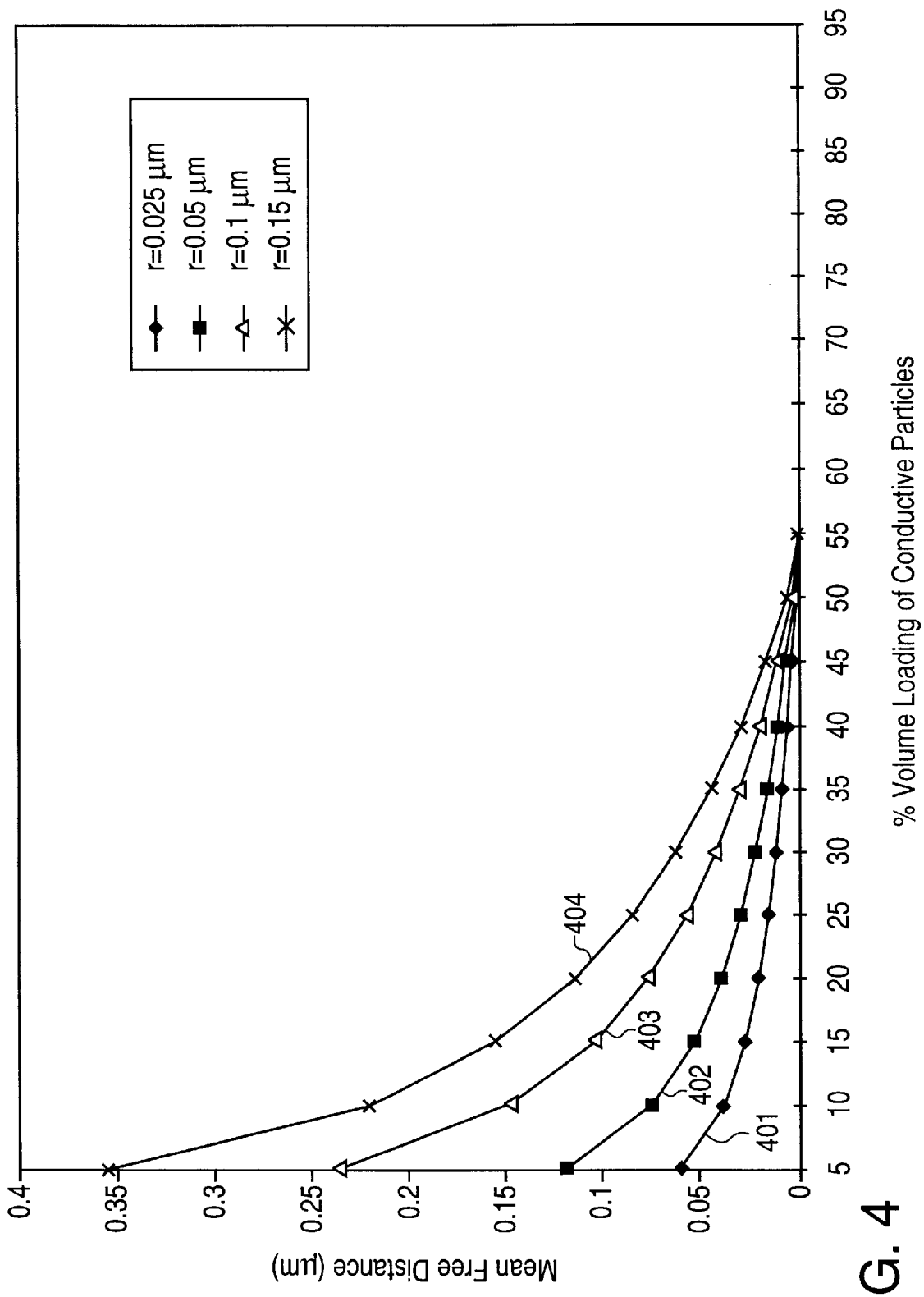
FIG. 4 shows mean free distance between two conductive particles as a function of loading and particle size, assuming uniform particle size and uniform dispersion.

Addition of mean free distances Dm (FIG. 3A) between an average number of particles 311A–311N in a predetermined composite thickness Tc provides an effective thickness Te (not shown) that determines the breakdown voltage of composite antifuse 320. For a composite thickness Tc=1 micron and a particle diameter Dp=1 micrometer, the mean free distance Dm between spherical particles as a function of loading for various particle radii, for example graph 401 for radius 0.025 $\mu$m, graph 402 for radius 0.05 $\mu$m, graph 403 for radius 0.1 $\mu$m, and graph 404 for radius 0.15 $\mu$m is shown in FIG. 4.

A composite 310 for use in composite antifuse 320 has a loading lower than 50%. On adding particles more than 50%, the mean free distance becomes 0 and composite 310 is shorted regardless of the particle size. Such a shorted composite can be used in a novel hybrid antifuse as described below.

In one embodiment, a particle radius of 0.05 $\mu$m and a loading of 30% results in a composite with the mean free distance Dm of 0.02 $\mu$m. The thickness Tc of a composite that includes one particle and one mean free path is 0.12 $\mu$m. In another embodiment, a composite of thickness Tc of 1 $\mu$m has eight uniformly dispersed particles. Therefore the effective nonconductive matrix thickness is Te=0.16 $\mu$m(0.02 $\mu$m*8).

Uniform dispersion of spherical particles 311A–311N is preferred in a composite 310 for one embodiment of a composite antifuse 320. Nonuniform dispersion results in reduced effective distance at the same loading as well as a large variation in the effective thickness both of which increase the variation in breakdown voltage as well as create yield problems for composite antifuse 320, but are acceptable for a hybrid antifuse described below.

Moreover, uniformity in particle size is preferred in one embodiment of a composite antifuse because a large particle size easily changes the effective thickness and creates large thickness variations. Methods of forming a uniform dispersion in a matrix are described in, for example, "Flow and Rheology in Polymer Composite Manufacturing" Edited by S. G. Advani Published by Elsevier Science 1994.

Based on the loading, a composite's effective capacitance can be calculated. In an embodiment in which the composite has a given loading (V %), the composite's effective capacitance C is related to the capacitance Co of no loading of a nonconductive body of same geometry (i.e. without particles) by an approximation of C=Co/ (1–V %). The particle size has no effect on this approximation.

For example, the effective capacitance C for a loading V %=30% is around 1.4 Co. If the matrix material is a-Si and the effective thickness Tc=0.16 $\mu$m the composite's capacitance is smaller than the capacitance of a single a-Si layer of the same thickness (e.g. 0.16 $\mu$m) by a factor of 4.

Furthermore, an a-Si layer has a dielectric constant of 11, whereas most polymers have a dielectric constant around 2 to 4, providing a 3 to 5 factor of reduction in the capacitance of the novel antifuse over the prior art.

Figure 9A:
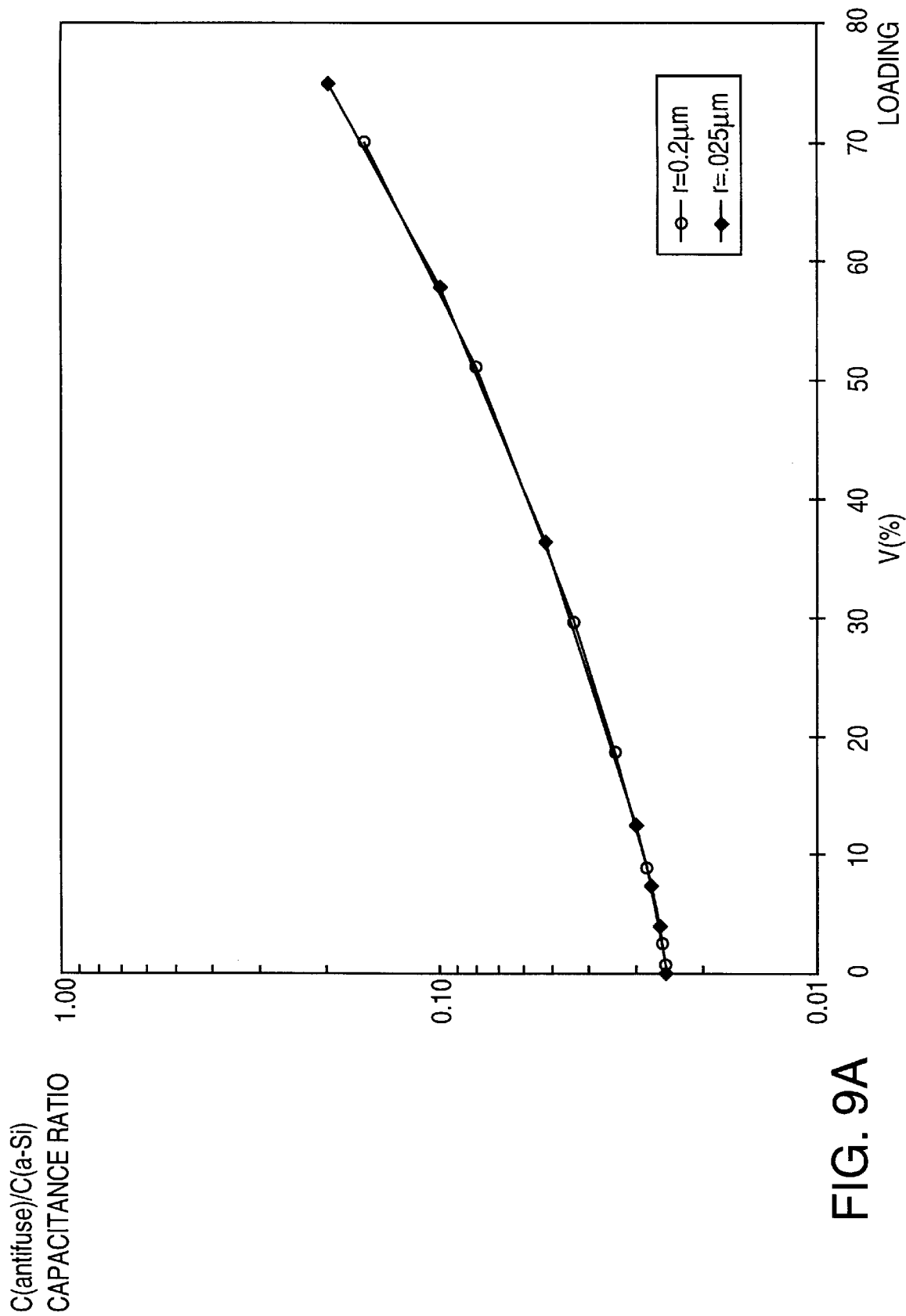
FIGS. 9A–9B illustrate the relation between an antifuse's capacitance and loading.

Therefore an antifuse of this invention can have a capacitance that is lower by a factor of more than 10 as compared to the prior art antifuse, as shown in FIG. 9A and described below. Such low capacitances allow the novel integrated circuit 300 to be faster than prior art. Such low capacitances also allow the novel antifuse 320 to be scaled further as technology advances.

Antifuse 320's (FIG. 3A) ON state resistance and reliability is influenced by the chemical composition of electrodes 302 and 305 as well as the conductive particles 311A–311N. A conductive particle's composition can be chosen independent of the electrode's composition to meet resistance and reliability requirements of a given application. Choice of conductive particles includes copper, platinum, palladium, Ti, Co, Mo, TiW, TiN. Also, a conductive core 351 (FIG. 3C) of, for example, copper can be coated or deposited with a layer 352 of conductive material for example Co, TiW, TiN or Ti to form a conductive particle 350.

Conductive materials such as high temperature solder(e.g. lead-tin 95%–5%, or 90%–10%) with melting temperature above 450° C. (the highest semiconductor processing temperature for one prior art process) can also be used to form conductive particles 311A–311N. Also, conductive polymer particles can be optionally coated with conductive metallic layers such as Cu, TiW, TiN, Ti or Co to form conductive particles 311A–311N.

Since all conductive particles 311A–311N of a composite 310 are made of conductive materials, the effective thickness Te of composite 310 can be chosen to be no larger than a thickness of antifuse dielectric layer 101 of the prior art. In such a case, the novel antifuse 320's resistance is in the same order of magnitude as the prior art antifuse, with the potential for further scale down by use of particles 311A–311N of a highly conductive material such as copper.

Novel antifuse 320 can be used by a user to perform a predetermined custom function, in a manner similar to the conventional antifuse, by application of a programming voltage between two electrodes 302 and 305 to switch novel antifuse 320 from an OFF state to an ON state. During such programming, the current does not flow by quantum mechanical tunneling, and rather the programming voltage causes physical breakdown of the nonconductive body 312 of composite 310 as the material of two adjacent particles fuses to form a link between the two particles. Therefore, an antifuse in the ON state passes current through a conductive channel 330 of a chain of particles and links (shown latched in FIG. 3A.

In composite 310, conductive channel (also called conductive path) 330 as described below is comprised wholly or predominantly of the materials of one or more of particles 311A–311N, due to minimal transportation of material of electrodes 302 and 305 into the body 312 during the antifuse's programming.

Figure 5A:
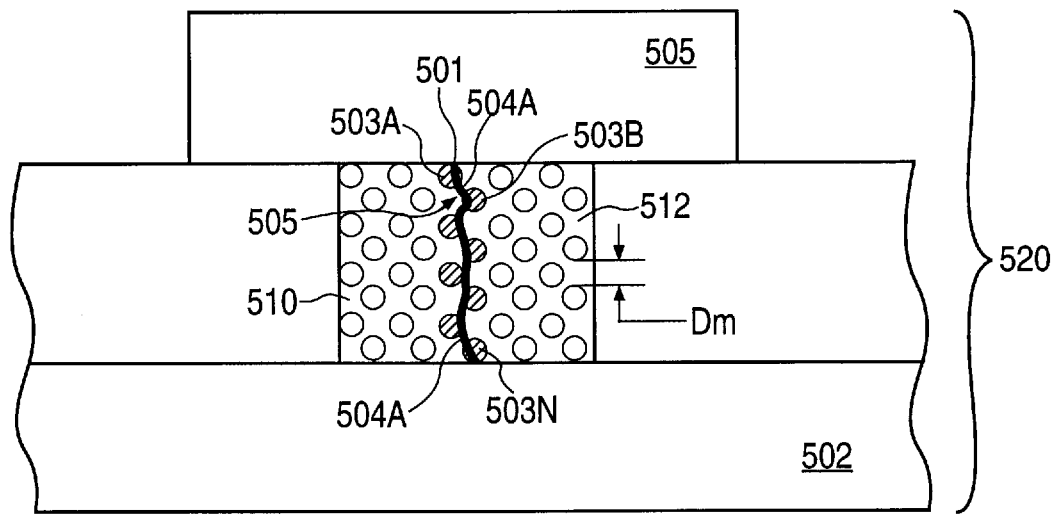
FIGS. 5A–5B illustrate in cross-sectional views a conductive channel formed by programming an antifuse composite having spherical particles of a size significantly or slightly less than the distance between the antifuse electrodes.

A conductive path 501 (FIG. 5A) passes through a chain of particles 503A–503N connected by links 504A–504N formed by fusion of the material of two adjacent particles e.g. particles 503A and 503B in the region 505 where the dielectric body 512 between particles 503A and 503B breaks down. Once a chain has formed and shorted antifuse 520's electrodes 502 and 505, no further chain forming occurs.

Figure 5B:
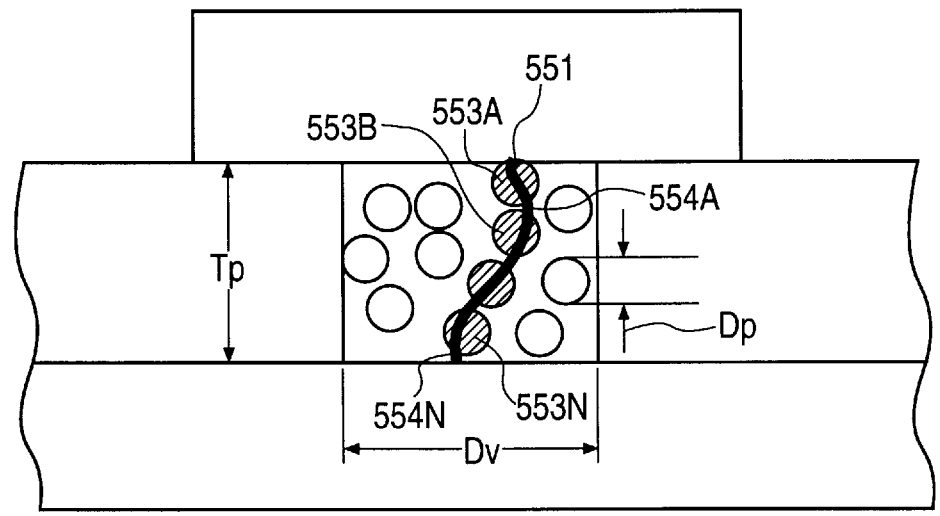

As the size of the particles 553A–553N (FIG. 5B) becomes larger, links 554A–554N become shorter and wider, and conductive-path 551 becomes more substantial, (of about the width of a link) so that the ON state resistance becomes smaller, and the current path becomes larger, thereby providing greater reliability.

When particle size Dp is close to but smaller than either electrode spacing, Tp, or via diameter, Dv, (FIG. 5B) e.g. particle size Dp is greater than 50% of via diameter Dv, small variations in any of the three dimensions can result in large variation of effective thickness Te that either creates shorts or significantly increases (e.g. by an order of magnitude) breakdown voltages. Use of particles 553A–553N with a large diameter can result in one antifuse via having one particle while another antifuse via contains no particle thus affecting antifuse yield reliability. Particles with a small diameter Dp (relative to electrode spacing Tp) result in antifuses with more reproducible characteristics, although at the expense of higher "ON" state resistance and less operational current due to the small widths of links and of conductive channel.

Particle size Dp and loading V % can be chosen to strike a balance between low resistance and high reliability that are needed for a given application. In one embodiment, particle size Dp is about 5 to 10 times smaller than electrode spacing Tp. In a variation of this embodiment with spacing Tp=1 $\mu$m, the particle radius (Dp/2) is chosen between 0.025 $\mu$m to 0.25 $\mu$m, with 0.05 $\mu$m being a preferred radius. Using upper limit radius 0.25 $\mu$m ensures that at least one particle is inside every via. Using lower limit radius 0.025 $\mu$m ensures that the average channel width is about 0.025 $\mu$m, for antifuse reliability.

In one embodiment, loading V % is between 10% to 30%, with 20% being a preferred value. Loading at lower limit of 10% ensures reasonable breakdown voltage of for example 10 volts. Loading at higher limit 30% reduces possibility of a short in the composite due to nonuniformity in size distribution and dispersion.

When technology scales down to allow interelectrode dielectric thickness Tp less than 1 $\mu$m, for example, 0.6 $\mu$m or 0.5 $\mu$m, then particle size Dp can be reduced to 0.05 $\mu$m to 0.1 $\mu$m and loading V % adjusted to meet predetermined values of programming voltage, ON state resistance and reliability.

In one embodiment, the breakdown voltage is around 10 volts, and the nonconductive matrix has a breakdown field close to 0.6 Mv/cm. In this embodiment, polymer materials are used to form the nonconductive matrix because for example, the breakdown voltage of polyimide is between 3–5 Mv/cm and that of epoxy is about 0.2 Mv/cm. Proper choice of polymer to obtain the necessary breakdown field is possible. Fluorine based polymers that have a high glass transition temperature and low dielectric constant can also be used to form the nonconductive matrix.

Given a predetermined material as the nonconductive matrix, the particle size and loading can be selected to obtain a predetermined breakdown voltage. In addition to conductive particles, very small oxide particles (e.g. 0.01 to 0.03 $\mu$m), of materials such as silica, or alumina can be added into the nonconductive matrix to modify the dispersion of particles and the programming voltage of the antifuse.

Several small diameter particles for use in an IC antifuse are commercially available. For example, palladium in the radius (Dp/2) of 0.04 to 0.09 $\mu$m, platinum in the radius (Dp/2) of 0.05 to 0.12 $\mu$m, 0.07 to 0.22 $\mu$m can be purchased from DeGussa Corporation, 3900 South Clinton Ave., South Plainfield, N.J. 07080, Phone (201)561-1100. Submicron copper particles are available from e.g. Aldrich Inorganics, 1001 West Saint Paul Avenue, Milwaukee, Wis. 53233.

In one embodiment of an IC antifuse, polyimides are used as the nonconductive matrix. Polyimide based composites can be deposited in an antifuse via in the same manner as conventional fabrication of semiconductor devices. Also, polyimide based composites are compatible with well known polyimide processes used in wafer fabrication, and hence these composites can also be used in conventional processes, with similar process parameters.

An inorganic spin-on glass(silicon dioxide) dielectric, is used in another embodiment as an IC antifuse composite's nonconductive matrix, in the same manner as is common for SOG in the semiconductor industry.

Fluorine based polymers having low dielectric constant and high temperature glass transition temperature can also be used as a composite's nonconductive matrix.

Since any nonconductive material can be used as the nonconductive matrix in a composite, materials such as a-Si, silicon dioxide, or silicon dioxide/silicon nitride composite such as (O, ON, ONO, NON, NO) can also be used where O is oxide and N is nitride. Furthermore, various combinations such as a-Si, O, N, and polymers can also be used to further tailor the nonconductive matrix material properties.

A composite can also be formed of conductive organic particles in either organic (polyimide) or inorganic (SOG) insulating matrices.

Figure 6A:
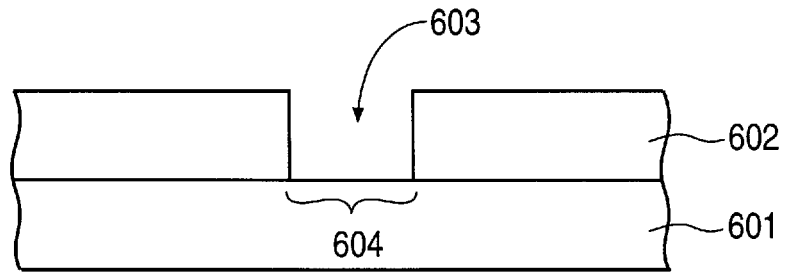
FIGS. 6A–6D, illustrate in cross-sectional views the processing steps used to form a composite antifuse.

In one embodiment, the novel composite antifuse is fabricated as follows. Using conventional methods, a first metal layer 601 (FIG. 6A) is deposited on a silicon substrate (not shown in FIG. 6A) and patterned. Then dielectric layer 602 is applied and patterned to form an antifuse via 603 directly over a region 604 of the first metal layer 601 where an antifuse 600 (FIG. 6D) is to be formed. Such conventional methods are described in, for example, "Silicon Processing for the VLSI Era" by S. Wolf, Volume II: Process Integration, Chapter 4, pp. 176–297 that is incorporated herein by reference in its entirety.

Figure 6B:
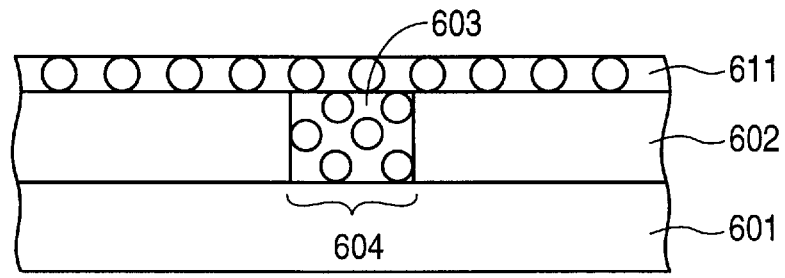
Figure 6C:
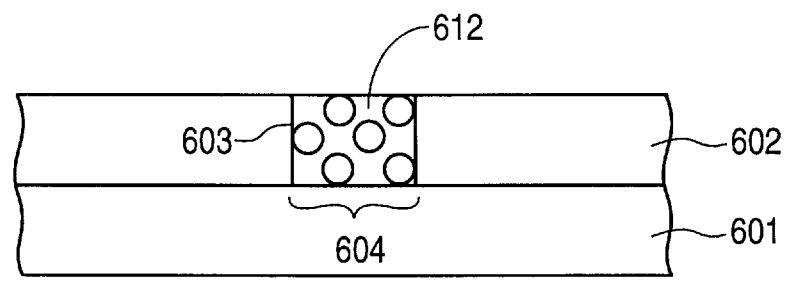

Next in FIG. 6B a composite layer 611 is applied to the surface and optionally processed to remove the composite everywhere except to form a cylindrical composite plug 612 (FIG. 6C) in antifuse via 603. A process for application of composite layer 611 can be for example spin on, spray or cosputter. Methods for removal of composite layer 611 can be for example mask and etch or direct chemical mechanical polishing (also called "CMP") that are similar to conventional semiconductor processes.

Next, in an optional step, conventional vias (not shown) can be opened in interelectrode dielectric layer 602 for connecting first metal layer 601 to a second metal layer 621 that is formed as described below.

Figure 6D:
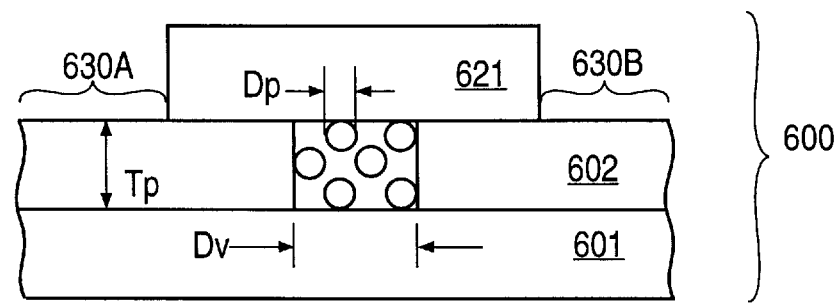

Finally a second metal layer 621 is deposited and patterned transverse to a lower electrode (of layer 601) to form the upper electrode of antifuse 600 as shown in FIG. 6D. If composite layer 611 is not removed, second metal layer 621 is deposited on composite layer 611 and a portion of composite layer 611, e.g. in regions 630A and 630B (FIG. 6D) can still be removed in a metal electrode overetch step. In such a metal overetch step, etch chemistry is adjusted such that conductive particles as well as nonconductive matrix material of composite layer 611 in e.g. exposed regions 630A and 630B can be removed away.

In one embodiment, antifuse via 603 has a diameter Dv of about 1 μm and the antifuse thickness that is determined by dielectric thickness Tp is around 0.6–1 μm. Particle size Dp in this embodiment is about 0.1 μm.

Figure 7A:
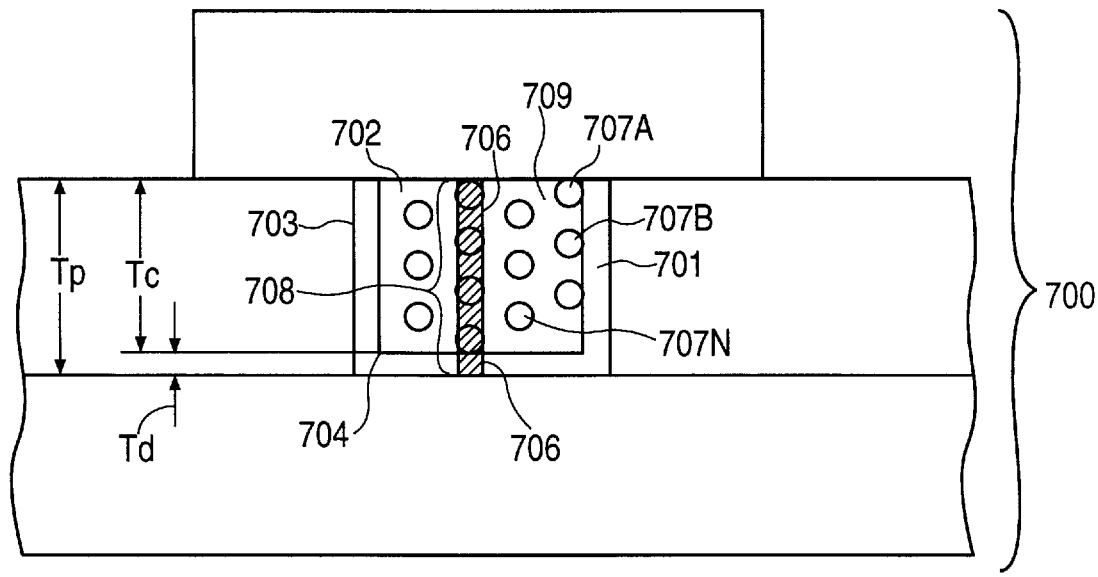
FIGS. 7A–7E illustrate in cross-sectional views five embodiments of a hybrid antifuse that includes at least one thin antifuse dielectric layer adjacent to the composite.

FIG. 7A illustrates a hybrid antifuse 700 that combines a thin antifuse dielectric layer 701 (of thickness Td) and a composite 702 (of thickness Tc) in antifuse via 703 (of length Tp=Tc+Td) to reduce capacitance and to control breakdown. Antifuse dielectric layer 701 can be, for example conventional oxide or ONO or amorphous silicon, or can be formed from thin organic materials deposited by sputtering, evaporation or vapor phase deposition. Parylene, for example can be deposited as antifuse dielectric layer 701 uniformly in thin films having good electrical properties, such as uniform breakdown voltages. In hybrid antifuse 700, layer 701 can be selected to determine the breakdown voltage with the composite loaded close to (e.g. only slightly smaller or larger than) critical volume Vc, so that composite 702 does not affect the breakdown voltage.

The resistance of a conductive channel portion 706 in antifuse dielectric layer 701 that is in series with the resistance of the composite's conductive channel portion 705, can become dominant so that the total resistance of conductive channel 708 is similar to the resistance of a conventional antifuse. Therefore an advantage of combining a composite 702 with an antifuse dielectric layer 701 is the lower OFF state capacitance of hybrid antifuse 700 as compared to the prior art while maintaining similar resistance as the conventional antifuse.

Presence of a thin antifuse dielectric layer 701 in the via corner (e.g. an edge) 704 can result in a well known thinning problem that reduces yield and reliability of prior art antifuses, in the absence of composite 702. In hybrid antifuse 700 (FIG. 7A), nonconductive matrix 709 covers edge 704 of antifuse via 703 and so eliminates the thinning problem. Also, the shape and size of particles 707A–707N can be chosen (e.g. spherical shape) to reduce the probability of a conductive particle directly touching edge 704 and so improve the yield and reliability.

Figure 7B:
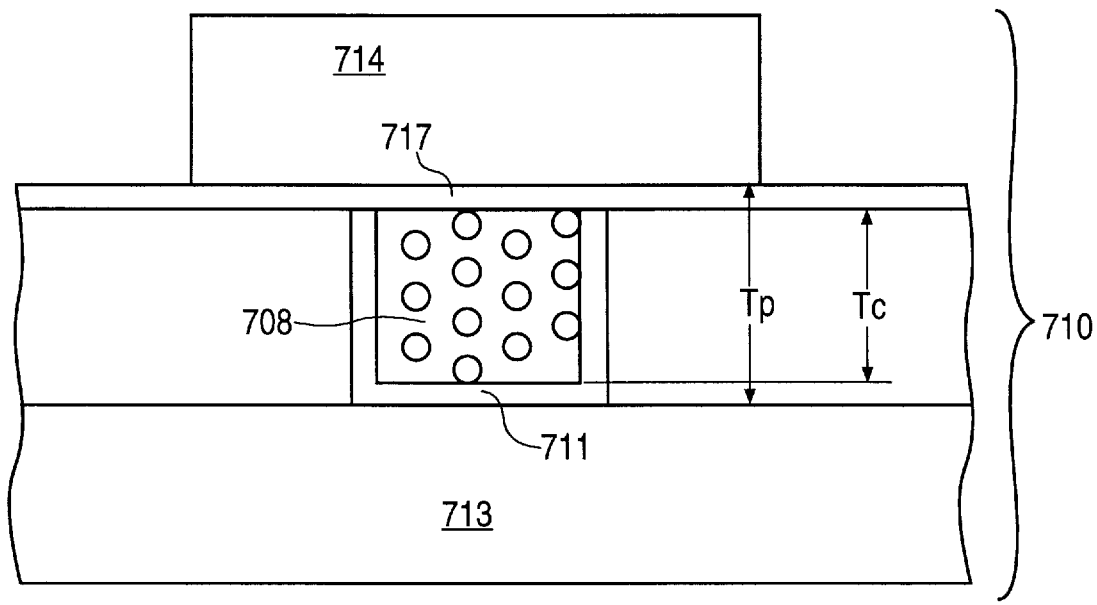
Figure 7C:
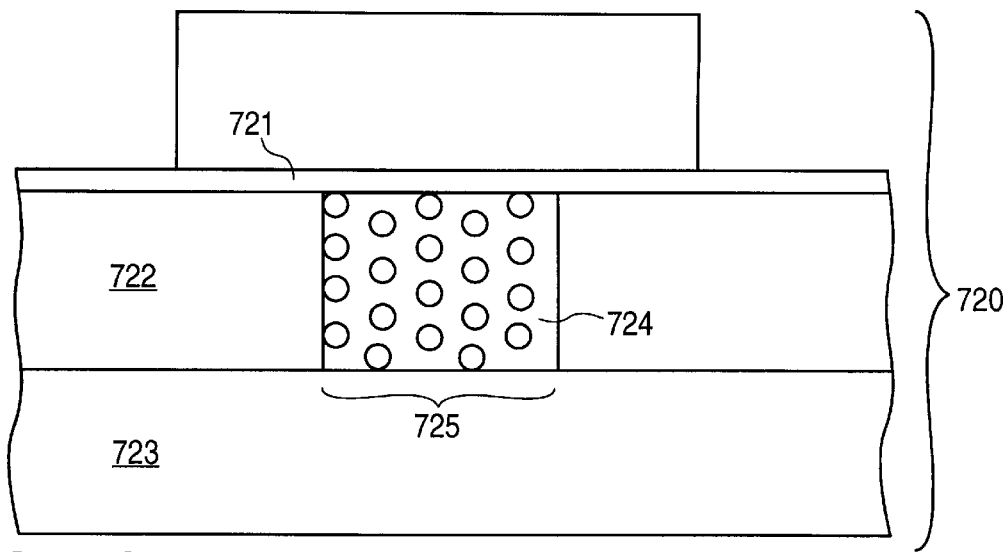
Figure 7D:
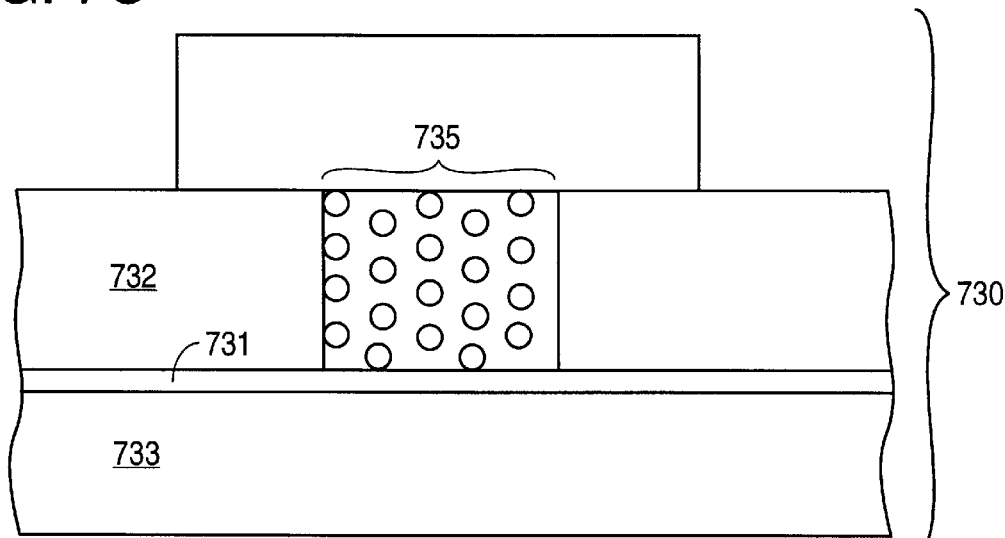

In addition to the embodiment illustrated in FIG. 7A, a hybrid antifuse can be formed in various other embodiments, such as the ones illustrated in FIGS. 7B–7D. Hybrid antifuse 710 (FIG. 7B) has two thin antifuse dielectric layers 711 and 717 that are adjacent to two electrodes 713 and 714 respectively. A first antifuse dielectric layer 711 is formed prior to formation of composite 712 and a second antifuse dielectric layer 717 is formed subsequent to formation of composite 712. Hybrid antifuse 710 is symmetric, e.g. thin antifuse dielectric layers 711 and 717 separate composite 712 from the respective electrodes 713 and 714. Such symmetric separation allows non-conductive matrix 712 to contain a reactive component, such as a polymer or solvent that needs to insulated from electrodes 713 and 714. Hybrid antifuse 710 also eliminates the thinning problem as described above.

Hybrid antifuse 720 (FIG. 7C) is similar to hybrid antifuse 700 (FIG. 7A) except that a thin antifuse dielectric layer 721 (FIG. 7C) is deposited on interelectrode dielectric layer 722 after formation of composite plug 724 in antifuse via 725. Hybrid antifuse 720 eliminates the thinning problem by eliminating the corner, e.g. corner 704 (FIG. 7A).

Hybrid antifuse 730 (FIG. 7D) is similar to hybrid antifuse 720 (FIG. 7C) described above, except that a thin antifuse dielectric layer 731 (FIG. 7D) is sandwiched between a first metal layer 733 and interelectrode dielectric layer 732. Hybrid antifuse 730 also eliminates the prior art corner and thereby eliminates the thinning problem.

Figure 7E:
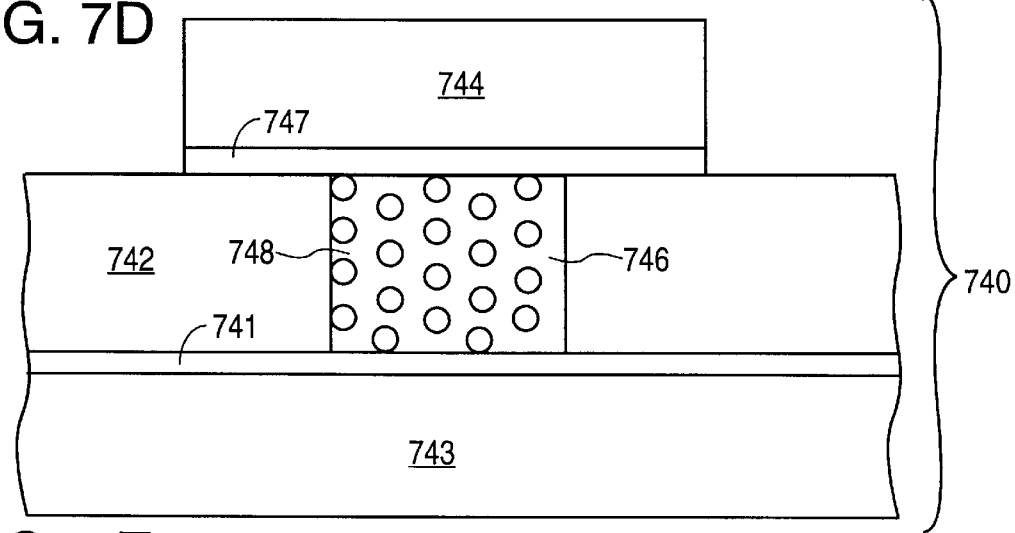

Hybrid antifuse 740 (FIG. 7E) is similar to hybrid antifuse 710 (FIG. 7B) described above, except that a first antifuse dielectric layer 741 is formed prior to formation of interelectrode dielectric layer 742 and a second antifuse dielectric layer 747 is formed subsequent to formation of composite 746. Hybrid antifuse 740 also eliminates the prior art corner and thereby eliminates the thinning problem. Moreover, hybrid antifuse 740 also allows non-conductive matrix 748 of composite 746 to contain a reactive component, such as a polymer or solvent that needs to insulated from antifuse electrodes 743 and 744.

Low resistivity of conductive particles 707A–707N (FIG. 7A) lowers the ON state resistance of composite 702 and so increases the current handling capability of channel 705. Therefore copper particles, for example, with a resistivity of 1.7 microhm.cm, are preferred over titanium particles with resistivity of 40 microhm.cm. The resistance and on state reliability of conductive channel 705 can be further improved by using large particle size.

The capacitance of an antifuse of this invention can be reduced without increasing the breakdown (i.e. programming) voltage which increase is necessary for a prior art antifuse. In a composite, such as composite 702 (FIG. 7A) the programming voltage is determined by the mean free distance Dm between the conductive particles e.g. particles 707A–707N and can, in the limit, be reduced to zero. Capacitance of composite 702 though increased by the presence of conductive particles 707A–707N, as compared to the capacitance of nonconductive body 709, is increased to a lesser extent than the capacitance of a dielectric layer of the same effective thickness as composite 702.

Therefore, even if a loading results in a short, the breakdown voltage of hybrid antifuse 700 is controlled by the thin antifuse dielectric layer 701 while the capacitance of hybrid antifuse 700 is controlled by composite 702's capacitance that is dominated by the smaller of the two capacitances, of composite 702 and thin dielectric layer 701.

Thin dielectric layer 701 can be formed of silicon dioxide, silicon nitride, with thickness in the range between 50 Å to 200 Å, parylene or polyimide between 100 Å to 500 Å, and amorphous silicon between 500 Å to 2000 Å, or a combination thereof such that the breakdown voltage is between 5 V to 20 V.

The conductive particles for composite 710 can be made of the materials listed above, and in addition, can be made of molybdenum, tungsten, titanium-nitride, tungsten, platinum, palladium, lead-tin, high glass transition temperature conductive polymer or metal coated conductive polymers.

The shape of the conductive particles of a hybrid antifuse 700 is not critical and can be other than spherical that was preferred in one embodiment of a composite antifuse. The shape of a hybrid antifuse's particles can be, for example flake or rod, as long as shorts occur at less loading than for spherical particles. If spherical particles are used, the particle size for a hybrid antifuse 700 should be larger than used previously for composite antifuse 600, to ensure low ON resistance and good reliability. The particle size for one embodiment of a hybrid antifuse 700 selected to be between 0.1 $\mu$m to 0.5 $\mu$m in radius, with 0.25 $\mu$m size being the preferred size. The larger particle size used in a hybrid antifuse allows small loading and higher current carrying capabilities. Hybrid antifuse 700 has a loading between 20% to 60% with 40% being the preferred loading. The above ranges of particle size and loading ensure that the ON resistance is low and antifuse 700 is reliable, although at the expense of a slight increase in capacitance. The capacitance can be decreased by using rod shaped or flake shaped particles such that less loading is required to obtain the same low ON resistance and reliability.

Figure 8A:
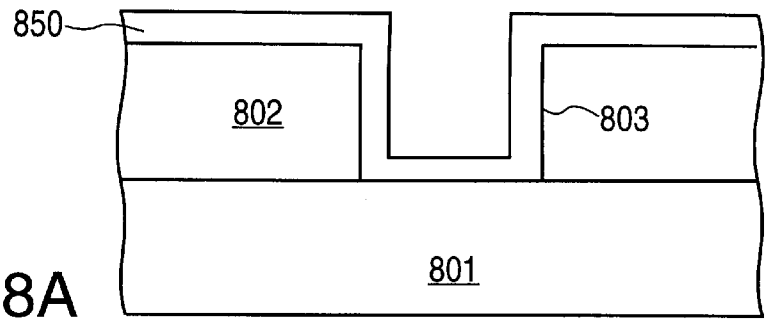
FIGS. 8A–8D illustrate in cross-sectional views the processing steps used to form a hybrid antifuse.
Figure 8B:
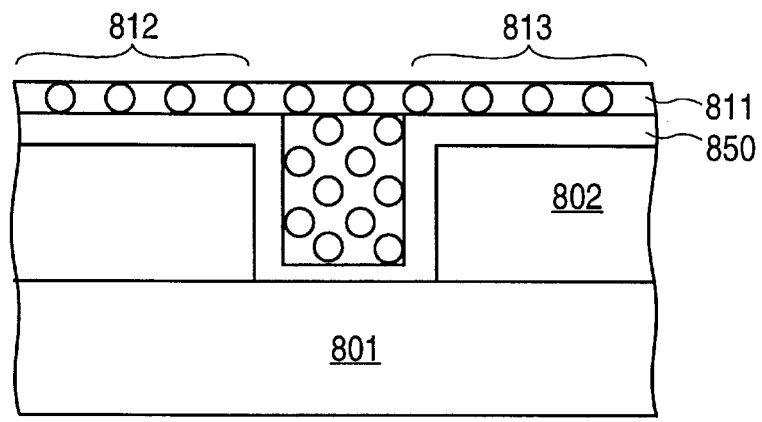
Figure 8C:
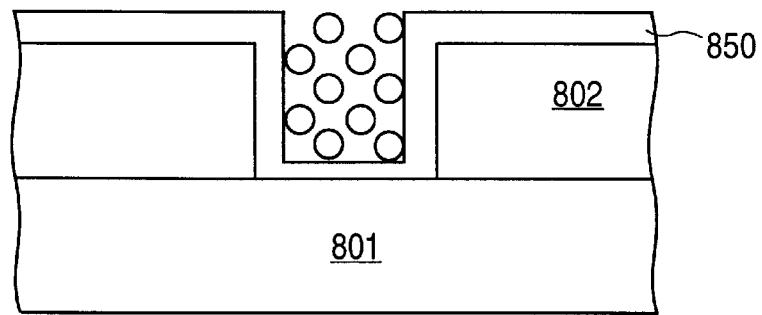

The fabrication steps for a hybrid antifuse, that are illustrated in FIGS. 8A–8D are similar to those for a composite antifuse illustrated in FIGS. 6A–6D except that a thin dielectric layer 850 of for example oxide, nitride, amorphous silicon, or a nonconductive polymer (such as polyimide, or paralyne, or SOG) or combinations of above layers, such as a-Silicon/nitride, oxide/nitride, polymer/a-Si, polymer/nitride, polymer/oxide, is deposited in an antifuse via 803 prior to applying a composite 811 (FIG. 8B).

Figure 8D:
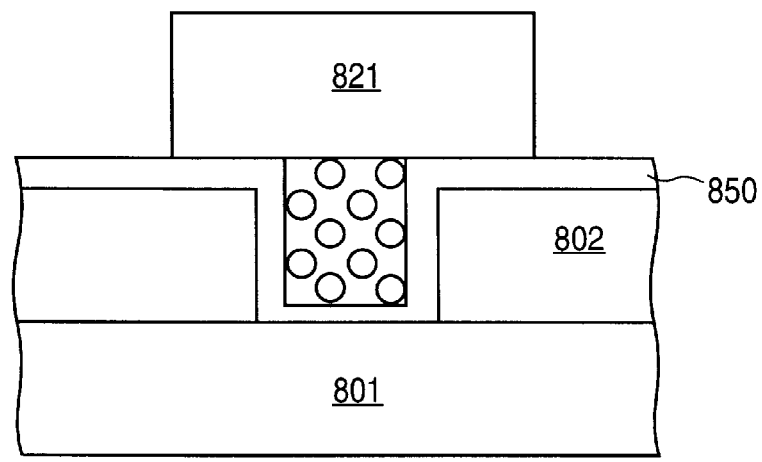

Briefly, first metal layer 801 is deposited and etched, an interelectrode dielectric layer 802 is formed and an antifuse via 803 opened, thin dielectric layer 850 (FIG. 8B) is formed inside antifuse via 803, followed by composite layer 811. An optional step of removing portions 812 and 813 of composite layer 811 (shown in FIG. 8C) can be followed by optionally forming a conventional via (not shown) and followed by forming second metal layer 821 (FIG. 8D).

Hybrid antifuse 710 (FIG. 7B) can be formed by depositing a second thin dielectric layer 717 over a composite layer 712 prior to deposition of second metal layer 714 thus forming a thin dielectric layer symmetrically adjacent to each electrode.

Hybrid antifuse 720 (FIG. 7C) is fabricated by not forming the thin dielectric layer 721 in an antifuse via 725 and instead forming a thin dielectric layer 721 prior to the second metallization to form second metal layer 726.

To form hybrid antifuse 730 (FIG. 7D), a first thin antifuse dielectric layer 731 is deposited before the interelectrode dielectric deposition and an antifuse via opening. Once via. 735 (FIG. 7D) is opened and the thin antifuse dielectric layer 731 is exposed, the other layers are formed as described above.

Depositing a thin antifuse dielectric layer 731 (FIG. 7D) prior to antifuse via formation reduces the step coverage effect inside the bottom of a via where the thin antifuse thickness maybe nonuniform (e.g. especially thin at the edge of the via as compared to a central region), and thus eliminates the need for a spacer.

The antifuse process of opening an antifuse via in an interelectrode dielectric layer followed by depositing a thin dielectric layer followed by deposition of composite layer has several advantages. In this antifuse process, plasma damage to the thin dielectric is less as oxide spacer etch is not needed and the antifuse surface is never exposed directly to the plasma environment. Planarization becomes better as less barrier metal layer, such as TiW, is needed in a top electrode layer. Better planarization results in higher yield, tighter pitch, smaller die size, and eventually lower cost and higher speed. Also, the addition of composite reduces an antifuse's leakage current during operation, which also improves reliability.

If a hybrid antifuse's composite is conductive, one or more thin dielectric layers ensure that the antifuse does not pass leakage current. Thus, nonuniformities in a composite can be tolerated more easily by a hybrid antifuse than by a composite antifuse. The hybrid antifuse's composite reduces the effective capacitance, due to reduced antifuse area (effective area of the particles) or due to the thickness of the composite layer.

Figure 9B:
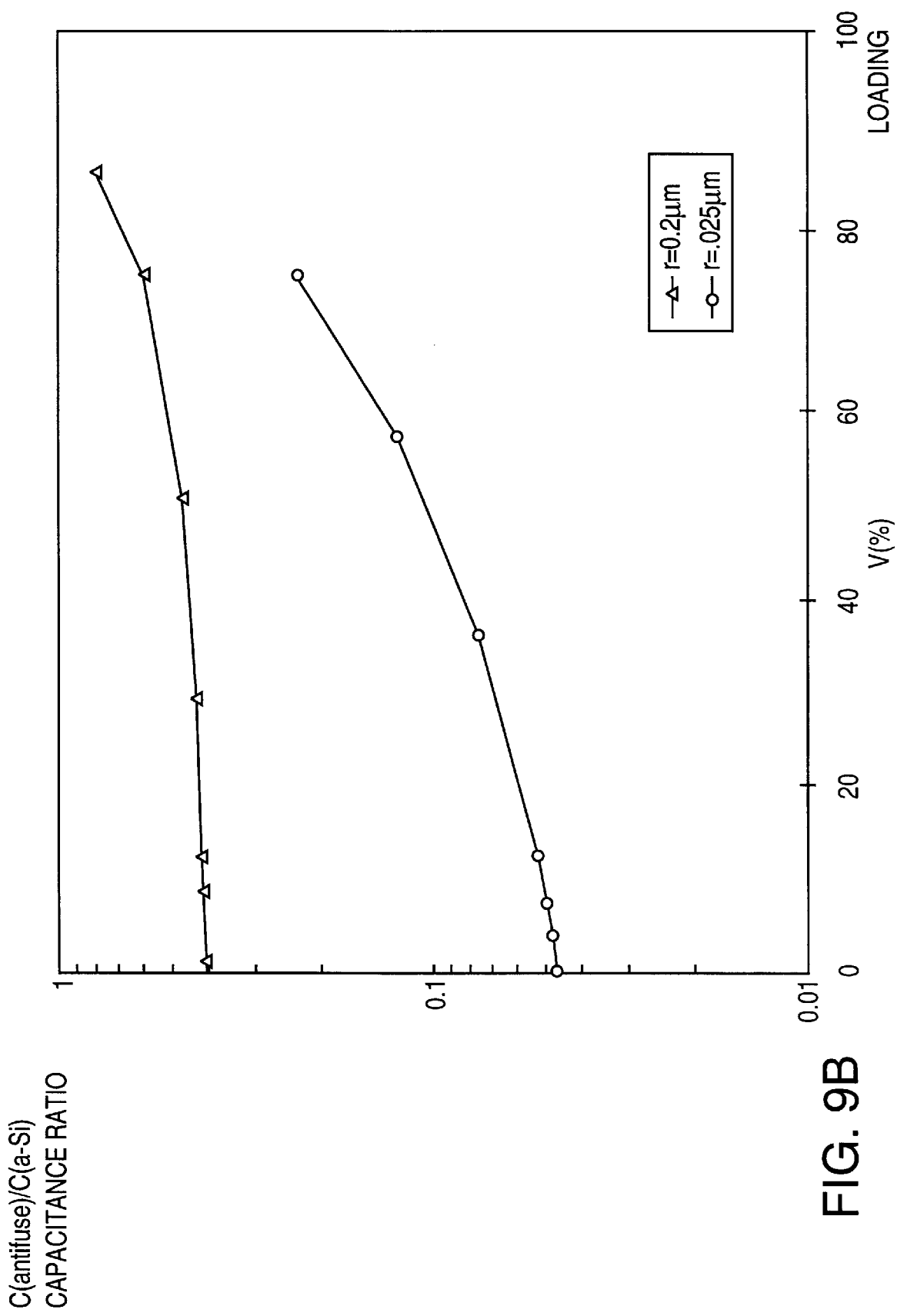

A relation between an antifuse's effective capacitance C (antifuse) as a fraction of capacitance of antifuse dielectric layer C (a-Si) and loading (V %) is illustrated in FIGS. 9A and 9B for a composite antifuse and a hybrid antifuse respectively. The graph of FIG. 9A is for cube particles of side Dp, wherein particle size r=(Dp/2) is 0.2 $\mu$m for one variation of antifuse 300 (FIG. 3A) and 0.025 $\mu$m for another variation. This graph is based on several assumptions, such as no shorts in composite 310. Therefore, variation in particle size has no effect on the capacitance of antifuse 300 for a given loading.

Figure 9C:
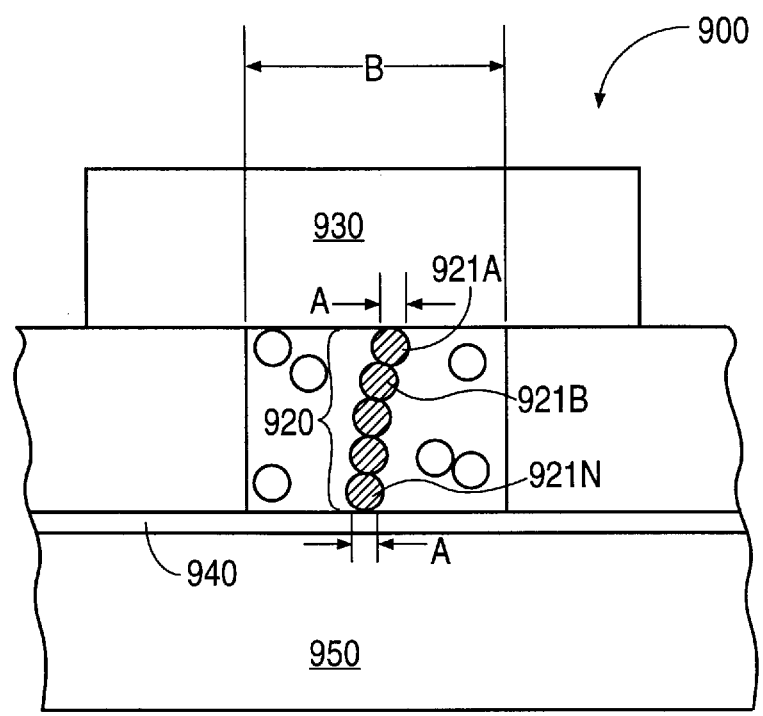
FIG. 9C illustrates a hybrid antifuse with a loaded short path formed by nonuniform agglomeration of particles.

However, the overall capacitance of a hybrid antifuse 700 (FIG. 7A) does depend on the particle size as illustrated by the graphs in FIG. 9B for particle sizes of 0.1 $\mu$m and 0.025 $\mu$m. Therefore the larger the particle size, the larger the capacitance, because of the larger area of contact A between a loaded short path 920 (FIG. 9C), electrode 930 and thin antifuse dielectric layer 940. Loaded short path 920 is formed by a nonuniform agglomeration of particles 921A–921N (shown shaded) that is assumed by the graph of FIG. 9B, and is desirable for one embodiment of a hybrid antifuse. Loaded short path 920 is conductive so that the resistance of thin antifuse layer 940 dominates the resistance of antifuse 900. The leakage current of the hybrid antifuse 900 is smaller than the leakage current of prior art antifuse because in hybrid antifuse 900, the electrode 930 in contact with the antifuse dielectric layer 940 has smaller area A than a prior art antifuse's area B.

Figure 10:
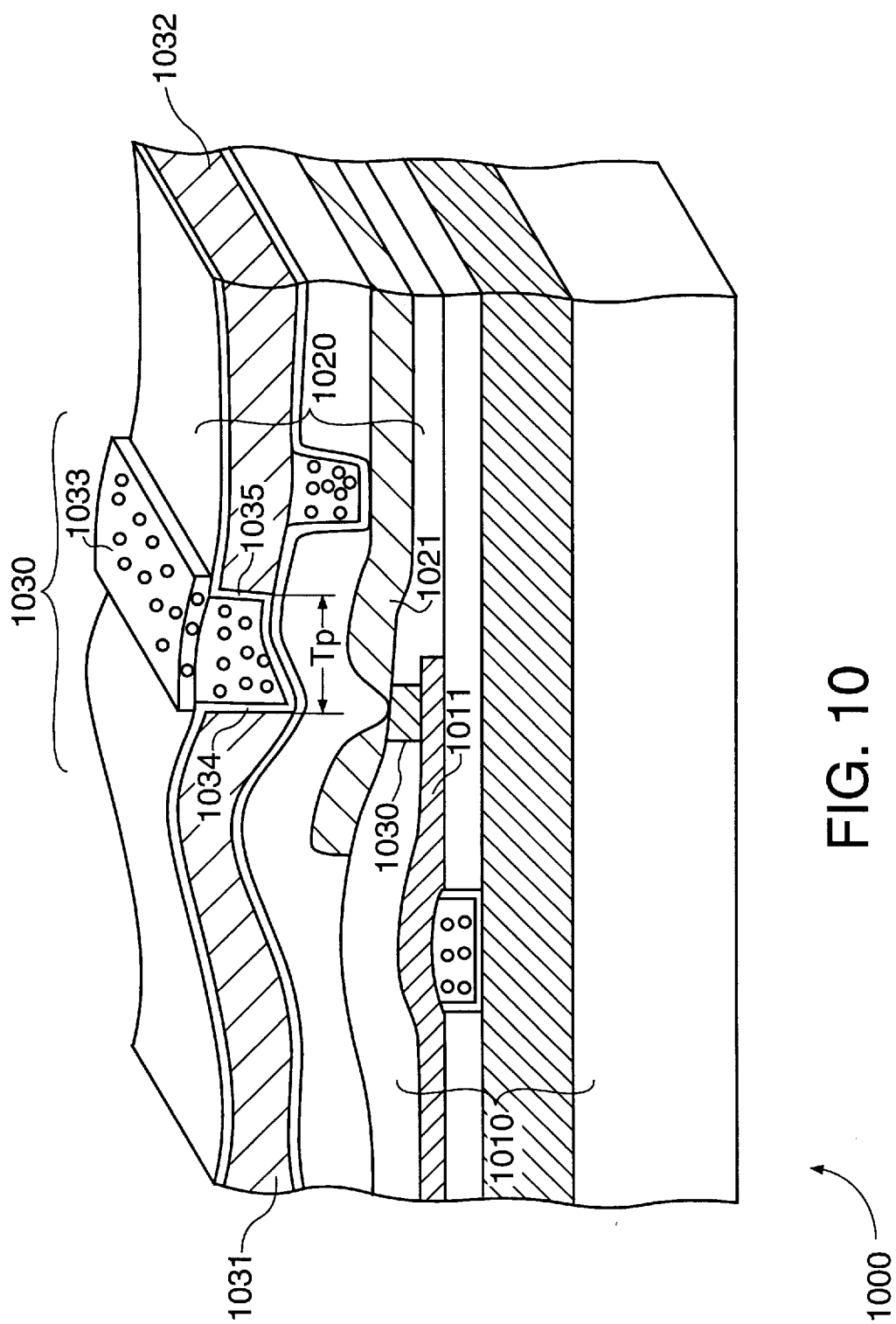
FIG. 10 illustrates in perspective cross-sectional view a structure with three antifuses of this invention.

Two antifuses 1010 and 1020 (FIG. 10) formed in an integrated circuit 1000 can be coupled to each other through a conventional via 1030 that connects electrode 1011 of antifuse 1010 and electrode 1021 of antifuse 1020. In FIG. 10, the hatched areas are conductive, the unshaded areas are insulative and the areas with circles are composites. Although in FIG. 10 antifuses 1010 and 1020 are illustrated as being hybrid antifuses of the type illustrated in FIG. 7A, any other antifuse illustrated in e.g. FIGS. 7B–7E or FIG. 3A can be used.

Integrated circuit 1000 also includes antifuse 1030 that is a "horizontal" antifuse formed of two electrodes 1031 and 1032 that are formed in the same conductive layer and that are separated from each other by a composite 1033 and thin antifuse dielectric layer portions 1034 and 1035. Antifuse 1030 is formed by deposition of a conductive layer that is patterned to define electrodes 1031 and 1032 and then a composite 1033 is formed between electrodes 1031 and 1032. An optional thin antifuse dielectric layer can deposited prior to the formation of composite 1033 to form portions 1034 and 1035.

One advantage of antifuse 1030 is that by using composite 1033, electrodes 1031 and 1032 can be separated from each other by a distance Tp of for example 0.5 to 2 microns that can formed by conventional pattern definition methods. Conventional pattern definition methods cannot be used to fabricate a horizontal antifuse having for example, a thin antifuse dielectric layer because the electrodes must have only a small spacing Tp, such as 0.1 micron to accommodate a thin antifuse dielectric layer.

Although the structure illustrated in FIG. 10 has been described above as being an integrated circuit 1000, a similar or identical structure can be fabricated using other technologies to form other products, such as a printed circuit board, a multi chip module and an integrated circuit package.

Numerous modifications and adaptations of the embodiments disclosed herein are encompassed within the broad scope of this invention. For example, although one embodiment of an integrated circuit antifuse has a composite with particles of uniform size, two or more groups of particles of different sizes and/or shapes can be combined to form a novel antifuse.

Various modifications and adaptations are encompassed by the attached claims.

We claim:

1. An integrated circuit comprising:

a semiconductor substrate;

a first electrode supported by said semiconductor substrate;

an interelectrode dielectric layer defining a antifuse via over a region of said first electrode;

a second electrode formed over a region of said interelectrode dielectric layer to cover said via;

a composite comprising a plurality of conductive particles dispersed within a nonconductive body, at least a portion of said composite being located within said antifuse via between said first electrode and said second electrode; and a first antifuse dielectric layer located between said first electrode and said second electrode;

wherein each of said conductive particles has a spherical shape;

wherein a conductive particle comprises a core of metal and a coating of conductive polymer surrounding said core; and wherein on application of a programming voltage between said first electrode and said second electrode, a conductive channel comprising at least a portion of one of said conductive particles is formed in said composite.

2. The integrated circuit of claim 1 wherein said nonconductive body comprises a material selected from the group consisting of polyimide, fluorine based polymer, parylene, spin on glass, silicon oxide, silicon nitride, and amorphous silicon.

3. The integrated circuit of claim 1 wherein said core comprises a material selected from the group consisting of copper, titanium, cobalt, molybdenum, titanium-tungsten, titanium nitride, tungsten, platinum, palladium and lead-tin.

4. The integrated circuit of claim 1 wherein each of said conductive particles has a radius ranging between 0.025 $\mu$m and 0.25 $\mu$m, and a loading of said composite is between 10% and 30%.

5. The integrated circuit of claim 1 wherein a volume percentage of said conductive particles is less than 50% of the total volume of said composite.

6. The integrated circuit of claim 1 further comprising a second antifuse dielectric layer, such that said composite is located between said first antifuse dielectric layer and said second antifuse dielectric layer.

7. The integrated circuit of claim 1 wherein said first antifuse dielectric layer comprises a material selected from the group consisting of polyimide, parylene fluorine based polymer, spin on glass, silicon oxide, silicon nitride, and amorphous silicon.

8. The integrated circuit of claim 1 wherein said first antifuse dielectric layer comprises silicon dioxide or silicon nitride with a thickness in the range of 50 Å to 200 Å.

9. The integrated circuit of claim 1 wherein said first antifuse dielectric layer is formed of parylene or polyimide having a thickness in the range of 100 Å to 500 Å.

10. The integrated circuit of claim 1 wherein each of said conductive particles has a radius in the range of 0.1 micrometer to 0.5 micrometer and said plurality of conductive particles occupy a volume of between 20 and 60% of volume occupied by said composite.

* * * * *